United States Patent [19]
Kida

[11] Patent Number: 5,268,743
[45] Date of Patent: Dec. 7, 1993

[54] APPARATUS FOR MEASURING FLATNESS OF OUTER LEAD

[75] Inventor: Tomoyuki Kida, Tokyo, Japan

[73] Assignee: NEC Corporation, Tokyo, Japan

[21] Appl. No.: 985,941

[22] Filed: Nov. 16, 1992

[30] Foreign Application Priority Data

Nov. 14, 1991 [JP] Japan ................. 3-326462

[51] Int. Cl.$^5$ ................. G01B 11/00; G01N 21/88
[52] U.S. Cl. ................. 356/394; 356/237
[58] Field of Search ............. 356/371, 375, 376, 394, 356/398, 237; 250/561, 562

[56] References Cited

U.S. PATENT DOCUMENTS

| | | | |
|---|---|---|---|
| 5,114,229 | 5/1992 | Hideshima | 356/237 |
| 5,162,866 | 11/1992 | Tomiya et al. | 356/237 |
| 5,208,463 | 5/1993 | Honma et al. | 356/394 |

OTHER PUBLICATIONS

Patent Abstracts of Japan, vol. 15, No. 349, publication date Sep. 4, 1991, Abstract of 03-134507.
Patent Abstracts of Japan, vol. 11, No. 376, publication date Dec. 8, 1987, Abstract of 62-143448.

Primary Examiner—F. L. Evans

[57] ABSTRACT

A single-axle stage is moved in a direction from B to A while measuring the distance between a laser array displacement meter and an outer lead of a tape carrier package, and after completion of measurement in such a direction, a rotary stage is turned clockwise by 90 degrees and the single-axle stage is similarly moved in a direction from C to B, to collect data on the distance between the laser array displacement meter and each of outer leads which are enough to recognize the shape of each outer lead and to store them in an internal memory disposed in a CPU. The flatness of each outer lead is determined by calculating based upon these data a regression line for each outer lead and the maximum scatter amount of data in regard to the regression line by a single lead flatness operating unit. The flatness of each side of the tape carrier package is determined by performing a similar operation from similar data on one side by a one-side flatness operating unit. The flatness of each of the outer leads and the flatness of each side of the tape carrier package are measured at higher accuracy than that in the prior art microscopic observation and shortening of examination time is achieved.

12 Claims, 5 Drawing Sheets

APPARATUS FOR MEASURING FLATNESS OF OUTER LEAD

BACKGROUND OF THE INVENTION

1. Field of the Invention

The present invention relates to an apparatus for measuring the flatness of an outer lead of an integrated circuit package and in particular to an apparatus for measuring the flatness of an outer lead of a tape carrier package (hereinafter abbreviated as TCP).

2. Description of the Prior Art

In such a prior art lead flatness measuring apparatus, as shown in FIG. 1, a TCP 70 which has been positioned on an X-Y stage 71 has been observed from an upper position by a microscope 65. When the TCP 70 is focussed, the position of a lens-barrel of the microscope 65 is detected by a linear scale 66 and is converted by a Z decoder 67 into a numerical value representative of the distance between the front end of an objective lens and the surface of an observed outer lead 72, i.e. one of Data Points 61 as shown in FIG. 2. Similar measurements are repeated by driving the X-Y stage 71 along the outer lead 72 and recording the numerical values indicated by X, Y and Z decoders 69, 68 and 67 so that a plurality of measurement values which are necessary to recognize the outer shape of the outer lead 72, i.e. all the Data Points 61 in FIG. 2, are determined.

A regression line, i.e. a Line 1, of the Data Points 61, a Line 2 which is parallel with the Line 1, passes through any of the Data Points 61 and is farthest in an upward direction from the Line 1, and a Line 3 which is parallel with the Line 1, passes through any of the Data Points 61 and is farthest in a downward direction from the Line 1 are calculated by manual operation of these Data Points 61. Lead flatness 93 is obtained by calculating the distance between the Lines 2 and 3.

Such measurement and operation are performed for each of all the outer leads 72 on the TCP 70 to determine the flatness 93 of each outer lead 72. The Max. Point 62 and the Min. Point 63 among the Data Points 61 which the Lines 2 and 3 pass, respectively, are recorded for each outer lead. The maximum Max. Point 62 and the minimum Min. Point 63 among the Max. Points and Min. Points thus obtained, respectively, are determined for each side of the TCP 70, and the difference therebetween is determined as the flatness of a side.

Since a person manually carries out the measurement in the prior art lead flatness measuring apparatus shown in FIG. 1, it takes an average of two minutes to measure one Data Point. Since at least 50 Data points are needed to determine the flatness of one outer lead 72, 100 minutes is necessary per one outer lead 72.

In the case that the TCP 70 has, for example, at least 100 outer leads 72, it takes not less than 10,000 minutes, i.e. about 167 hours (7 days) to determine the flatnesses of 4 sides.

There are problems that an increase in the number of examination steps in a fabricating process of the TCP directly causes an increase in price of TCP and indirectly induces extension of period of time of delivery to customers. There is also a problem that, since measurement is performed with eyes of human being through the microscope 65, the measured values vary widely from one measuring person to the other and thus the reliability on the measured values is low.

SUMMARY OF THE INVENTION

It is an object of the present invention to provide a lead flatness measuring apparatus which achieves high accurate measurement and reduction in examination period of time in comparison with the prior art measurement through microscopic observation.

In order to accomplish the above mentioned object of the present invention, there is provided an apparatus for measuring the flatness of an outer lead of an integrated circuit package, comprising: a laser array displacement meter which irradiates the outer lead with laser beams, reads a light reflected by the outer lead and converts the reflected light into a voltage; means for digitizing the voltage output from the laser array displacement meter; a memory for storing digitized numerical values; first operating means for calculating the flatness of the outer lead from the digitized numerical values; second operating means for calculating the flatness of each side of the integrated circuit package from the digitized numerical values; a driven stage for positioning the integrated circuit package below the laser array displacement meter and feeding the integrated circuit package; external storage means for storing the flatnesses of the outer lead and each side which were calculated by the first and second operating means; output means for displaying the flatnesses of the outer lead and each side; an external storage unit for preliminarily storing the standards for flatnesses; and means for comparing the standards for flatnesses stored in the external storage unit with the flatnesses calculated by the first and second operating means to evaluate the latter flatnesses.

DESCRIPTION OF THE PREFERRED EMBODIMENTS

A lead flatness measuring apparatus of the present invention is capable of measuring the flatnesses of each outer lead and each side of a TCP by means of a combined mechanism including a laser array displacement meter and a driven stage.

The present invention will now be described in more detail with reference to drawings.

Embodiment 1

Figure 3:
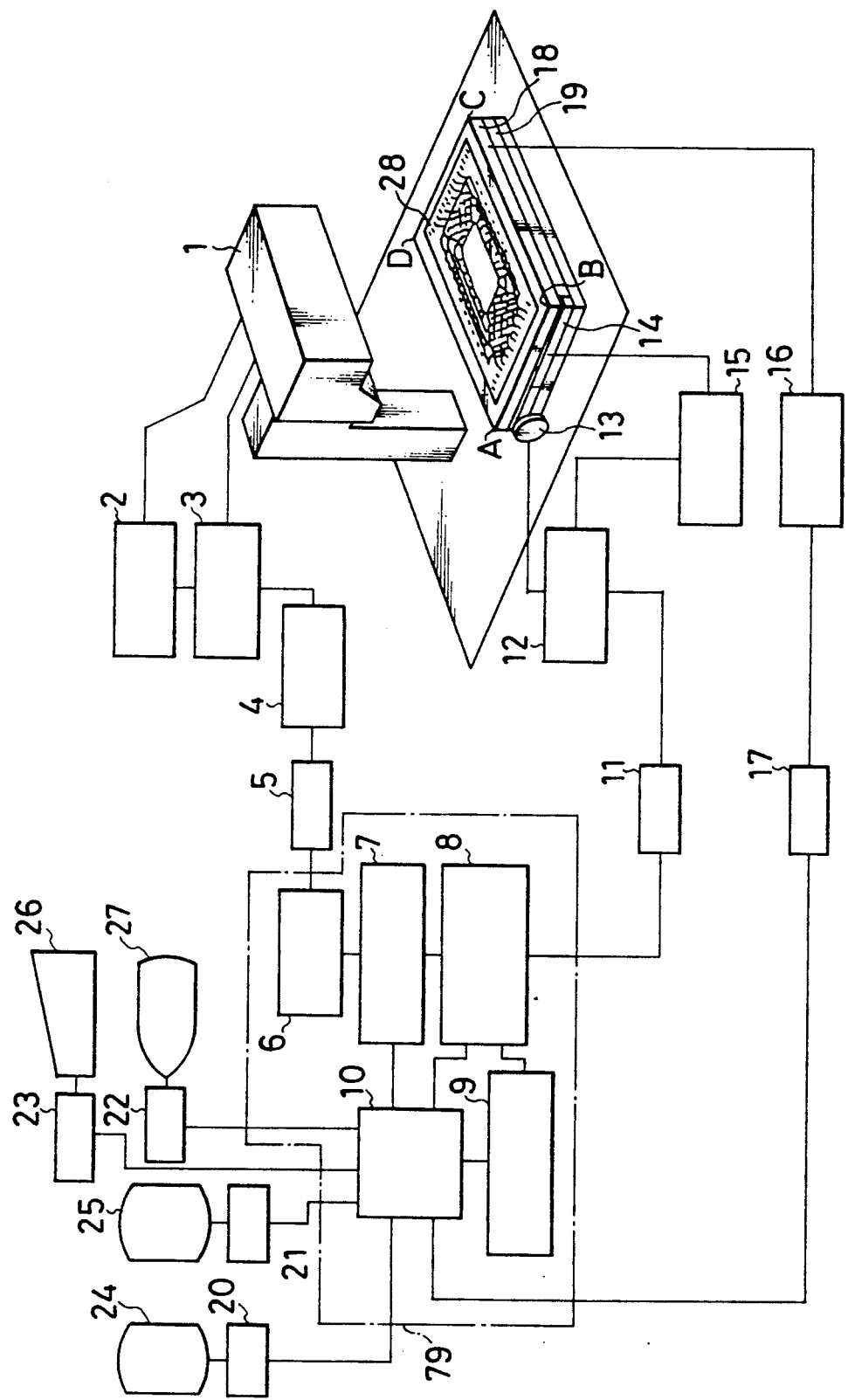
FIG. 3 is a combination of a block diagram and a perspective view showing the system of an Embodiment 1 of the present invention.
Figure 4A:
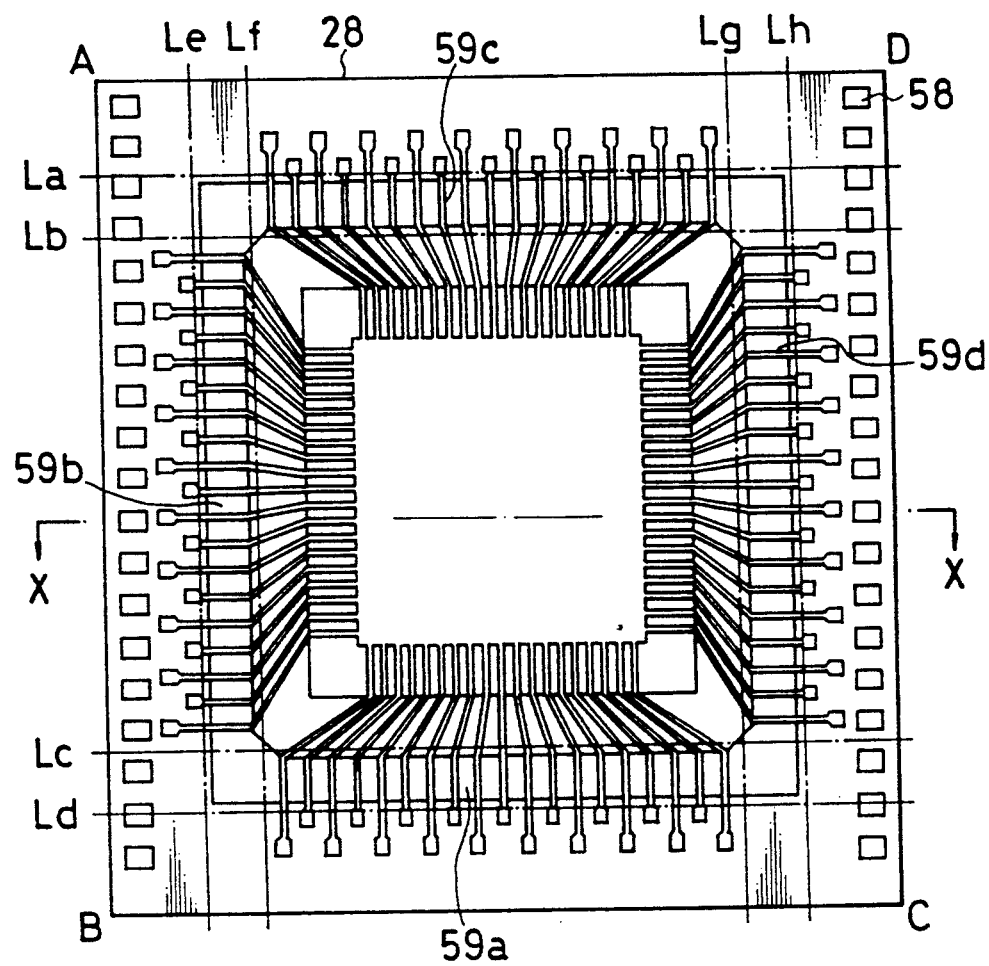
FIG. 4A is a plan view showing a TCP.
Figure 4B:
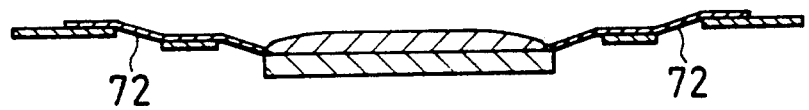
FIG. 4B is a cross-sectional view of the TCP taken along a line X—X in FIG. 4A.

Referring now to FIG. 3, a TCP 28 to be measured is positioned on a rotary stage 18 by using positioning holes (i.e. sprocket holes) 58 made in edges of the TCP as shown in FIG. 4A and is fixed to the rotary stage. On the rotary stage 18, there are provided projections having the same contour and pitch as those of the positioning holes 58 so that the TCP 28 can be always fixed in the same position on the rotary stage 18.

Figure 5:
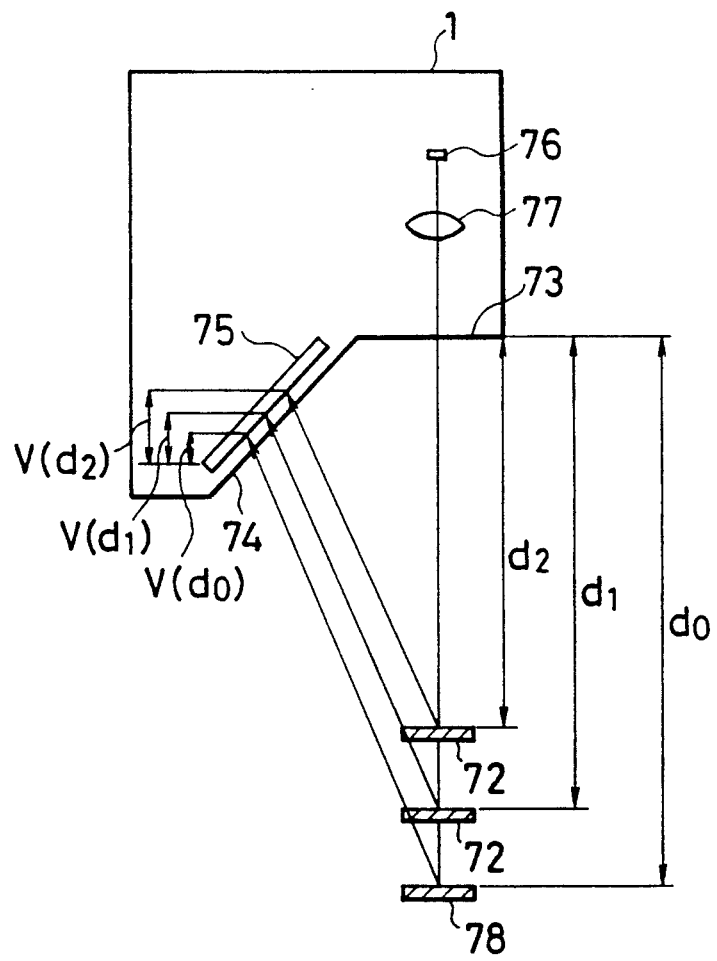
FIG. 5 is a schematic view explaining the mechanism of a laser array displacement meter.

A laser array displacement meter 1 in FIG. 3 comprises, as shown in detail in FIG. 5, a light emitting portion 73 (50 mm in length) having 1667 semiconductor lasers which are arrayed in one line at a pitch of 30 μm (which corresponds to measurement resolution 64 in FIG. 2) and at a longer direction of an outer lead 72, and a light receiving portion 74 including an area CCD (charge coupled device) 75 having the same width as the portion 73, the light receiving portion 74 receiving reflected lights of the lights which are emitted from the light emitting portion 73 through lens 77 and reflected by the outer lead 72. The area CCD 75 outputs a potential level corresponding to the distance between the light emitting portion 73 and the outer lead 72 for each of the semiconductor lasers 76.

A power supply 2 for the laser array displacement meter 1 shown in FIG. 3 supplies device drive power to the semiconductor lasers 76 and the area CCD 75 in FIG. 5.

A laser array displacement meter controller 3 connected to the power supply 2 makes correction and control for the voltage output so that the relation between the output voltage $V(d_1)$ from the area CCD 75 based on the light reflected by an outer lead 72 to be measured which is remote from the light emitting portion 73 by a distance $d_1$ and the output voltage $V(d_0)$ from the area CCD 75 based on the light reflected by a reference surface 78 which is remote from the light emitting portion 73 by a known distance $d_0$ which is preliminarily recorded has a linearity represented by the following formula:

$$d_0 : d_1 = V(d_0) : V(d_1) \qquad (1)$$

An A/D converter 4 in FIG. 3 converts 1667 potential levels which are fed from the laser array displacement meter controller 3 into digitized numerical values and transmits them to a voltage-distance converting unit 6 via an I/O 5.

The voltage-distance converting unit 6 is disposed in a CPU 79, converts the numerical values inputted from the I/O 5 into distances in accordance with the formula (1) and sends the converted distances to a single lead flatness operating unit 7.

A single-axle stage 19 on which the rotary stage 18 is set is driven by a servo-motor 13 in a direction along a line A-B or D-C in FIG. 3. The amount of movement of the stage 19 is traced by a change in potential of a linear scale 14.

The output potential from the linear scale 14 is digitized by a decoder 15 and is normalized, and the normalized signal is sent to a servo-motor controller 12.

Initial values of parameters on the TCP 28 and amounts of shift movement of the TCP 28 which are necessary to measurement of lead flatness, and the tolerance standards for the lead flatness are preliminarily recorded on an external parameter file 24.

The initial values and the amounts of shift movement, which are preliminarily stored in the external parameter file 24, are transmitted from the file 24 to the servo-motor controller 12 via an I/O 20, a control unit 10, an internal memory 8 and an I/O 11. The servo-motor controller 12 compares the numerical values fed from the decoder 15 with the above-mentioned initial values and shift movement amounts to control the position of the TCP 28 on the rotary stage 18. The positional information is constantly transmitted from the servo-motor controller 12 to the control unit 10 via the I/O 11 and the internal memory 8.

Closed areas in FIG. 4A, i.e. $L_a$-$L_b$-$L_f$-$L_g$, $L_c$-$L_d$-$L_f$-$L_g$, $L_b$-$L_c$-$L_e$-$L_f$ and $L_b$-$L_c$-$L_g$-$L_h$, which are enclosed by lines $L_a$, $L_b$, $L_c$, $L_d$, $L_e$, $L_f$, $L_g$ and $L_h$, correspond to areas including the outer leads 72 of the TCP 28 which are to be measured. The number of the outer leads is not limited to that shown in FIG. 4A and may be varied depending on the TCP.

The control unit 10 retrieves from the initial values stored in the external parameter file 24 the distance between the light emitting portion 73 and outer leads which are nearest to the side AD of the TCP 28 at the closed areas $L_b$-$L_c$-$L_e$-$L_f$ and $L_b$-$L_c$-$L_g$-$L_h$ (i.e. objects to be measured 59b and 59d in FIG. 4A), and compares the retrieved initial value with data on the current position of the TCP 28 which is fed from the servo-motor controller 12. When the control unit 10 confirms that the TCP 28 has been fed to such a position that the light emitting portion 73 of the laser array displacement meter 1 is in parallel with the outer leads in objects to be measured, it issues an instruction to start the data fetch to the single lead flatness operating unit 7.

The pitch among the outer leads 72 is stored as the shift movement amount in the parameter file 24. After the first outer lead has been measured, the control unit 10 repeats to issue an instruction to start data fetch to the single lead flatness operating unit 7 every time when the TCP 28 is moved by the shift movement amount.

Figure 1:
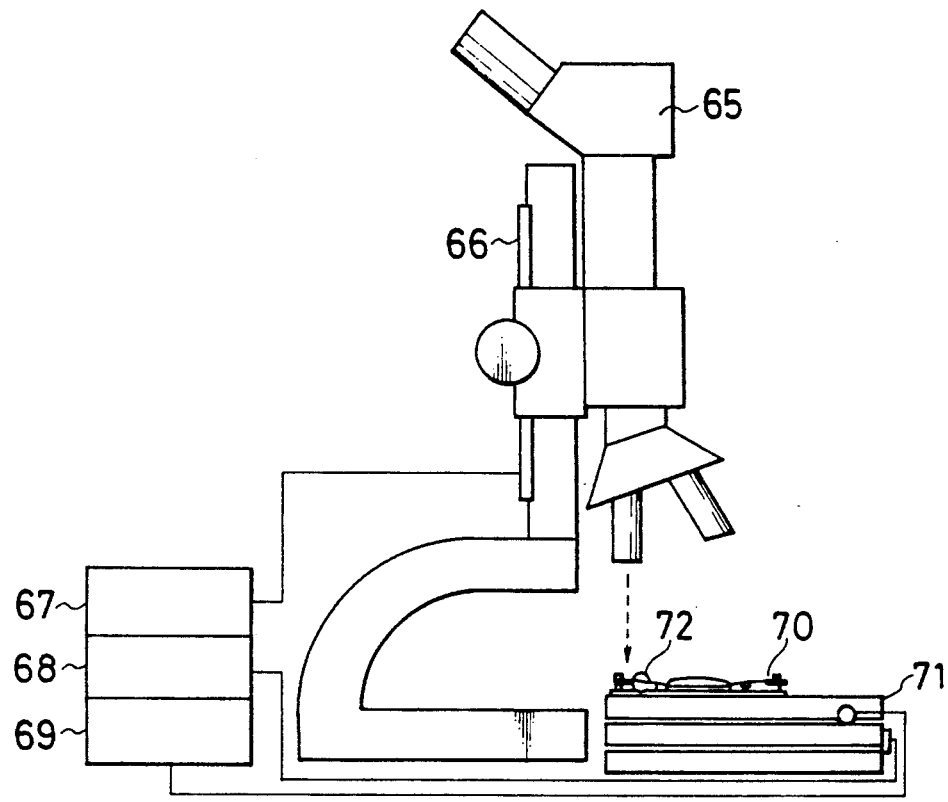
FIG. 1 is a schematically elevational view showing a prior art lead flatness measuring apparatus.
Figure 2:
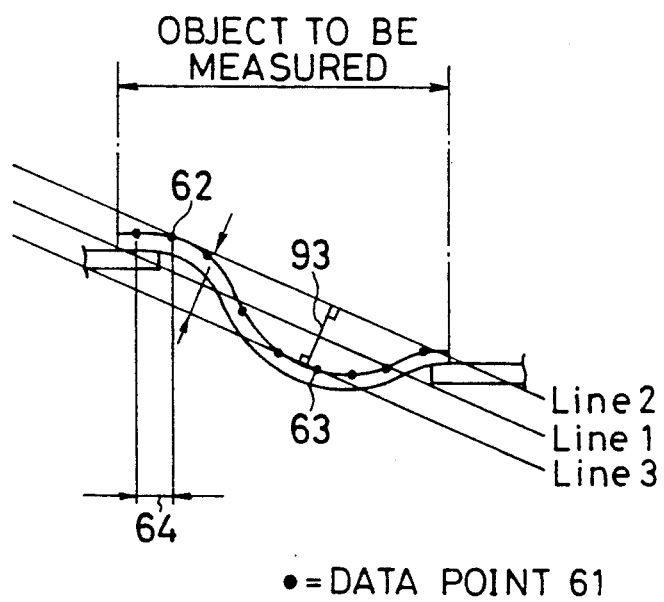
FIG. 2 is an explanation view showing the measuring points on an outer lead of a TCP.

Every time when the single lead flatness operating unit 7 is instructed by the control unit 10, it fetches a group of the numerical values fed from the voltage-distance converting unit 6 and omits the numerical values of the objects other than the objects to be measured 59b and 59d. Then a regression line, Line 1, shown in FIG. 2 is determined for each of the objects to be measured 59b and 59d according to a least squares method. Next, a Line 2 is calculated so that it is parallel with the Line 1, passes through any of the Data Points 61 and is above and farthest from the Line 1, and a Line 3 is calculated so that it is parallel with the Line 1, passes through any of the Data Points 61 and is below and farthest from the Line 1. Thereafter, the lead flatness 93 for one outer lead is determined by calculating the distance between the Lines 2 and 3, the results being transferred from the single lead flatness operating unit 7 to the internal memory 8. It takes 10 seconds to complete the calculation of the lead flatness since the measurement of one outer lead.

The single lead flatness operating unit 7 temporarily transfers all the measured values obtained in the objects to be measured 59b and 59d to the internal memory 8.

The control unit 10 repeats the above-mentioned measurement and operation after inching the single-axle stage 19 in a direction from B to A by the pitch among leads. When all the outer leads of the objects to be measured 59b and 59d are measured, the control unit 10 issues an instruction to start the operation to a one-side flatness operating unit 9 and also issues an instruction to a rotary stage controller 16 via an I/O 17 and to the servo-motor controller 12 via the I/O 11.

It takes 3 seconds to perform one pitch feed of the single-axle stage 19.

The one-side flatness operating unit 9 individually reads from the internal memory 8 all measured values obtained in regard to the outer leads of the objects to be measured 59b and 59d, and determines from the measured values Max. Point 62 and Min. Point 63 of Data Points 61 which for each lead the Lines 2 and 3 pass through, respectively. Then, for each side it determines the maximum Max. Point and the minimum Min. Point among these Max. Points and Min. Points, respectively and determines the difference between the maximum Max. Point and the minimum Min. Point as the flatness of the side, and then transfers data on the flatness to the internal memory 8. It takes one second to perform the operation of the flatness of one side.

The rotary stage controller 16 turns the rotary stage 18 clockwise by 90 degrees in accordance with the instruction from the control unit 10 and the servo-motor controller 12 returns the single-axle stage 19 to the origin by driving the servo-motor 13. It takes 2 seconds to turn the rotary stage 18 by 90 degrees.

After the one-side flatness operating unit 9 completes the operation, the control unit 10 reads the lead flatness of each outer lead and the one-side flatness of each side (sides AB and DC in FIG. 4A) from the internal memory 8 and stores them in a data storage file 25 via an I/O 21. The control unit 10 compares the read lead flatnesses and one-side flatnesses with the lead flatnesses and the one-side flatnesses which are recorded in the parameter file 24 to evaluate the former flatnesses and displays the result of each side and the evaluation results on a CRT 27 display via an I/O 22. The internal memory 8 is reset. The control unit 10 is connected to a keyboard 26 via an I/O 23.

Since measurement of the outer leads in the closed areas $L_a$-$L_b$-$L_f$-$L_g$ and $L_c$-$L_d$-$L_f$-$L_g$ shown in FIG. 4A is made similarly to that of the above-mentioned closed areas $L_b$-$L_c$-$L_e$-$L_f$ and $L_b$-$L_c$-$L_g$-$L_h$, description thereof will be omitted herein.

Embodiment 2

Figure 6:
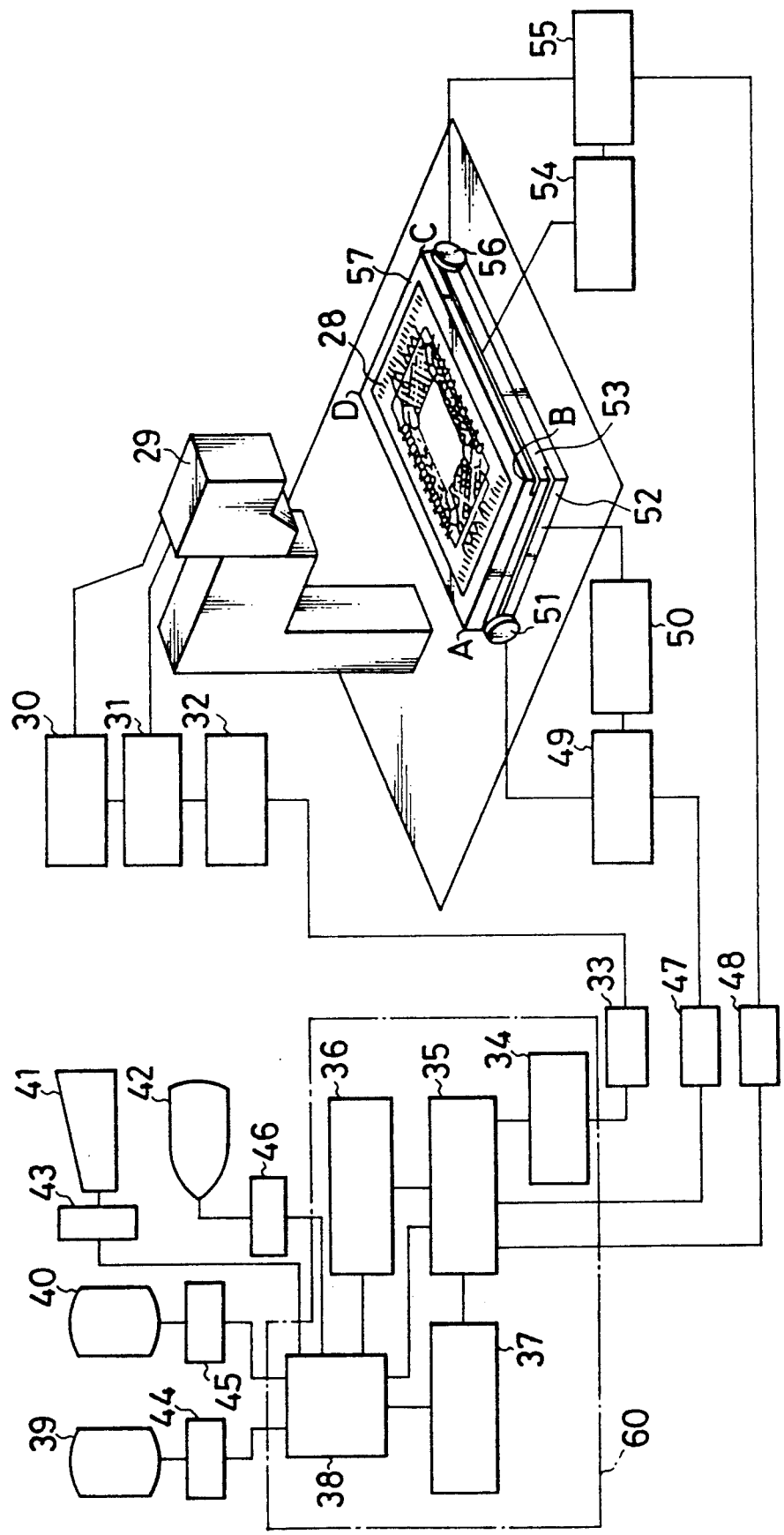
FIG. 6 is a combination of a block diagram and a perspective view showing the system of an Embodiment 2 of the present invention.

Referring now to FIG. 6, there is shown a combination of a block diagram and a perspective view showing the system of an Embodiment 2 of the present invention.

A TCP 28 to be measured is positioned on an X-Y stage 57 by using the positioning holes (i.e. sprocket holes) 58 as shown in FIG. 4A and is fixed to the stage.

Principles and roles of a laser array displacement meter 29, a power supply 30 for the laser array displacement meter, a laser array displacement meter controller 31, an A/D converter 32 and a voltage-distance converting unit 34 disposed in a CPU 60 via an I/O 33 in FIG. 6 are similar to the corresponding elements in Embodiment 1. Accordingly, description of these elements will be omitted herein.

The output potentials from linear scales 53 and 52 in FIG. 6 are digitized and are normalized by X and Y decoders 54 and 50, and then are fed from the decoders to servo-motor controllers 55 and 49, respectively.

Initial values of parameters on the TCP 28 and amounts of shift movement of the TCP 28 which are necessary to measurement of lead flatness, and the tolerance standards for the lead flatness are preliminarily stored in an external parameter file 39.

The initial values and shift movement amounts, which are preliminarily stored in the external parameter file 39, are transmitted from the file 39 to the servo-motor controllers 55 and 49 via an I/O 44, a control unit 38, an internal memory 35 and I/Os 48 and 47. The servo-motor controllers 55 and 49 compare the numerical values which are fed from the respective X and Y decoders 54 and 50 with the above-mentioned initial values and shift movement amounts to controll the position of the TCP 28 on the X-Y stage 57. This positional information is constantly transmitted from the servo-motor controllers 55 and 49 to the control unit 38 via the I/Os 48 and 47 and the internal memory 35.

The control unit 38 reads from the initial values stored in the parameter file 39 the coordinates on the X-Y stage 57 of a point of the outer lead 72 which is closest to the line $L_f$ of the closed area $L_a$-$L_b$-$L_f$-$L_g$ (i.g. the object to be measured 59c in FIG. 4A) from a corner A of the TCP 28 in FIG. 4A and further which is nearest to the line La from the corner A. Then, the control unit 38 compares this read initial value with the present position of the TCP 28 which is fed from the servo-motor controllers 55 and 49. When the controller unit 38 confirms that the TCP 28 has moved to such a position that a light emitting portion of the laser array displacement meter 29 is lain on top of the outer lead, it issues to the internal memory 35 an instruction to start the data fetch.

The shift movement amount in the parameter file 39 includes the pitch between the outer leads and the data fetch intervals (which correspond to the measurement resolution 64 in FIG. 2). The control unit 38 controls the measurement while the X-Y stage 57 feeds the TCP 28 in parallel with the side AB and in a direction from B to A in step with the intervals of the measurement resolution 64, the TCP 28 being fed with a servo-motor 51 through the servo-motor controller 49. After completion of the feed between the lines $L_a$ and $L_b$, the X-Y stage 57 is fed with a servo-motor 56 through the servomotor controller 55 such that the TCP 28 is shifted in parallel with the side AD and in a direction from D to A by the spacing between the leads.

When measurement of all the outer leads in the object to be measured 59c is completed by repeating a series of the above-mentioned measurement, the control unit 38 issues an instruction to a single lead flatness operating unit 37 and one-side flatness operating unit 36. The internal memory 35 is reset.

The single lead flatness operating unit 37 reads data on one outer lead from the internal memory 35 to calculate the lead flatness by the same method as that in the foregoing Embodiment 1 and repeats the same procedures same times as the number of the outer leads.

Since function of the control unit 38, a data storage file 40 via an I/O 45 and a CRT 42 via an I/O 46 after the calculation of each lead flatness is similar to that of the control unit 10, the data storage file 25 and the CRT 27 in Embodiment 1, description thereof will be omitted herein. The control unit 38 is connected to a keyboard 41 via an I/O 43.

After completion of measurement of one side (i.e. the object to be measured 59c in FIG. 4A), the control unit 38 drives the X-Y stage 57 in order of the closed area $L_e$-$L_f$-$L_b$-$L_c$ (i.e. the object to be measured 59b in FIG. 4A), the closed area $L_c$-$L_d$-$L_f$-$L_g$ (i.e. the object to be measured 59a in FIG. 4A) and the closed area $L_g$-$L_h$-$L_b$-$L_c$ (i.e. the object to be measured 59d in FIG. 4A), and measurement for the remaining sides is conducted in order. Calculation of the flatness is all conducted for all the four sides.

The present Embodiment 2 has an advantage that saving in the internal memory 35 can be achieved in contrast to the foregoing Embodiment 1 in which processing for every 2 sides is performed since each of four sides of the TCP 28 is separately measured in Embodiment 2, and that it is possible to measure even TCP 28 in which the arrangement and the number of the outer leads on opposite sides or four sides are different each other since four sides are independently measured and thus the degree of freedom in Embodiment 2 is higher than that in Embodiment 1 which is capable of measuring only the TCP 28 in which opposite sides are symmetrical.

Since the process from measurement to calculation of the flatness is automatically carried out in accordance with the present invention as mentioned above, the amount of scatter in measured values varying from one measuring person to the other can be eliminated in comparison with prior art measuring devices, and the measuring period of time can be remarkably shortened to about 1/500 of that in the prior art through the use of a measuring means including a laser array displacement meter and a positioning mechanism including a servo-motor or servo-motors.

While this invention has been particularly described with reference to the preferred embodiments thereof, it will be understood by those skilled in the art that the foregoing and other changes in form and details may be made therein without departing from the spirit and scope of the invention.

What is claimed is:

1. An apparatus for measuring the flatness of an outer lead of an integrated circuit package, comprising:
    a laser array displacement meter which irradiates said outer lead with laser beams, reads a light reflected by said outer lead and converts the reflected light into a voltage;
    means for digitizing the voltage output from said laser array displacement meter;
    a memory for storing digitized numerical values;
    first operating means for calculating the flatness of said outer lead from said digitized numerical values;
    second operating means for calculating the flatness of each side of said integrated circuit package from said digitized numerical values;
    a driven stage for positioning said integrated circuit package below said laser array displacement meter and feeding said integrated circuit package;
    external storage means for storing the flatnesses of said outer lead and each side which were calculated by said first and second operating means;
    output means for displaying the flatnesses of said outer lead and each side;
    an external storage unit for preliminarily storing the standards for flatnesses; and
    means for comparing the standards for flatnesses stored in said external storage unit with the flatnesses calculated by said first and second operating means to evaluate the latter flatnesses.

2. The apparatus for measuring the flatness of an outer lead of an integrated circuit package as defined in claim 1 in which said laser array displacement meter comprises a light emitting portion having semiconductor lasers arrayed in one line and a light receiving portion for receiving a light emitted from said light emitting portion and reflected by said outer lead, said light receiving portion including a charge coupled device area which has the same width as said light emitting portion and outputs a potential level corresponding to the distance between said light emitting portion and said outer lead for each of said semiconductor lasers.

3. The apparatus for measuring the flatness of an outer lead of an integrated circuit package as defined in claim 2 in which said light emitting portion is 50 mm in length and has 1667 semiconductor lasers arrayed in one line at a pitch of 30 $\mu$m.

4. The apparatus for measuring the flatness of an outer lead of an integrated circuit package as defined in claim 1 which further comprises means for converting said digitized numerical values into distance between said light emitting portion and said outer lead.

5. The apparatus for measuring the flatness of an outer lead of an integrated circuit package as defined in claim 1 in which said integrated circuit package is provided with a plurality of positioning holes made in edges thereof and said driven stage comprises a rotary stage provided with projections having the same pitch and contour as those of said positioning holes and a single-axle stage on which said rotary stage is set, said single-axle stage being provided with a servo-motor for driving the single-axle stage and a linear scale for tracing the amount of movement of the single-axle stage by a change in potential.

6. The apparatus for measuring the flatness of an outer lead of an integrated circuit package as defined in claim 5 which further comprises decoding means for digitizing output potential from said linear scale and normalizing digitized output potential, said decoding means being connected to said servo-motor via a servo-motor controller.

7. The apparatus for measuring the flatness of an outer lead of an integrated circuit package as defined in claim 1 in which said integrated circuit package is provided with a plurality of positioning holes made in edges thereof, and said driven stage comprises an X-Y stage provided with projections having the same pitch and contour as those of said positioning holes, servo-motors for driving the X-Y stage and linear scales for tracing the amount of movement of the X-Y stage by a change in poential.

8. The apparatus for measuring the flatness of an outer lead of an integrated circuit package as defined in claim 7 which further comprises X decoding means and Y decoding means for digitizing output potentials from said linear scales and normalizing digitized output potentials, said X and Y decoding means being connected to said servo-motors via servo-motor controllers, respectively.

9. The apparatus for measuring the flatness of an outer lead of an integrated circuit package as defined in claim 1 in which said output means comprises a cathode ray tube display.

10. The apparatus for measuring the flatness of an outer lead of an integrated circuit package as defined in claim 1 in which said integrated circuit package is a tape carrier package.

11. An apparatus for measuring the flatness of an outer lead of a tape carrier package, comprising:
    a laser array displacement meter which irradiates said outer lead with laser beams, reads a light reflected by said outer lead and converts the reflected light into a voltage, said laser array displacement meter comprising a light emitting portion of 50 mm in length which has 1667 semiconductor lasers arrayed in one line at a pitch of 30 $\mu$m and a light receiving portion for receiving a light emitted from said light emitting portion and reflected by said outer lead and said light receiving portion including a charge coupled device area which has the same width as said light emitting portion and outputs a potential level corresponding to the distance between said light emitting portion and said outer lead for each of said semiconductor lasers;

an A/D converter for digitizing the voltage output from said laser array displacement meter, said converter being connected to said laser array displacement meter via a laser array displacement meter controller;

a voltage-distance converting unit for converting digitized voltage into the distance between said light emitting portion and said outer lead;

a single lead flatness operating unit for calculating the flatness of said outer lead from the converted distance;

an internal memory for storing data on the flatness calculated in said single lead flatness operating unit;

a one-side flatness operating unit for calculating the flatness of each side of said tape carrier package from the data on the single lead flatness read from said internal memory;

a driven stage for positioning said tape carrier package below said laser array displacement meter and feeding said tape carrier package, said driven stage comprising a rotary stage and a single-axle stage on which said rotary stage is set, said rotary stage being provided with projections having the same pitch and contour as those of positioning holes provided in edges of said tape carrier package, and said single-axle stage being provided with a servo-motor for driving the single-axle stage and a linear scale for tracing the amount of movement of the single-axle stage by a change in potential;

a decoder for digitizing output potential from said linear scale and normalizing digitized output potential, said decoder being connected to said servo-motor via a servo-motor controller;

an external data storage file for storing the flatnesses of said outer lead and each side which were calculated by said single lead flatness operating unit and one-side flatness operating unit, respectively;

a cathode ray tube display unit for displaying the flatnesses of said outer lead and each side;

an external parameter file for preliminarily storing the standards for flatnesses; and means for comparing the standards for flatnesses stored in said external parameter file with the flatnesses calculated by said single lead flatness operating unit and one-side flatness operating unit to evaluate the latter flatnesses.

12. An apparatus for measuring the flatness of an outer lead of a tape carrier package, comprising:

a laser array displacement meter which irradiates said outer lead with laser beams, reads a light reflected by said outer lead and converts the reflected light into a voltage, said laser array displacement meter comprising a light emitting portion of 50 mm in length which has 1667 semiconductor lasers arrayed in one line at a pitch of 30 $\mu$m and a light receiving portion for receiving a light emitted from said light emitting portion and reflected by said outer lead and said light receiving portion including a charge coupled device area which has the same width as said light emitting portion and outputs a potential level corresponding to the distance between said light emitting portion and said outer lead for each of said semiconductor lasers;

an A/D converter for digitizing the voltage output from said laser array displacement meter, said converter being connected to said laser array displacement meter via a laser array displacement meter controller;

a voltage-distance converting unit for converting digitized voltage into the distance between said light emitting portion and said outer lead;

an internal memory for storing data on said distance converted in said voltage-distance converting unit;

a single lead flatness operating unit for calculating the flatness of said outer lead from the data read from said internal memory, the flatness calculated being stored in said internal memory;

a one-side flatness operating unit for calculating the flatness of each side of said tape carrier package from the data on the flatness of said outer lead read from said internal memory;

a driven stage for positioning said tape carrier package below said laser array displacement meter and feeding said tape carrier package, said driven stage comprising an X-Y stage provided with projections having the same pitch and contour as those of positioning holes which are provided in edges of said tape carrier package, servo-motors for driving said X-Y stage and linear scales for tracing the amount of movement of the X-Y stage by a change in potential;

X and Y decoders for digitizing output potentials from said linear scales and normalizing digitized output potentials, said X and Y decoders being connected to said servo-motors via servo-motor controllers, respectively;

an external data storage file for storing the flatnesses of said outer lead and each side which were calculated by said single lead flatness operating unit and one-side flatness operating unit, respectively;

a cathode ray tube display unit for displaying the flatnesses of said outer lead and each side;

an external parameter file for preliminarily storing the standards for flatnesses; and means for comparing the standards for flatnesses stored in said external parameter file with the flatnesses calculated by said single lead flatness operating unit and one-side flatness operating unit to evaluate the latter flatnesses.

* * * * *